United States Patent
Myers

(10) Patent No.: US 11,609,637 B2
(45) Date of Patent: Mar. 21, 2023

(54) SWITCH ASSEMBLY WITH INTEGRATED HAPTIC EXCITER

(71) Applicant: Joyson Safety Systems Acquisition LLC, Auburn Hills, MI (US)

(72) Inventor: Kenneth Myers, Clarkston, MI (US)

(73) Assignee: Joyson Safety Systems Acquisition LLC, Auburn Hills, MI (US)

(*) Notice: Subject to any disclaimer, the term of this patent is extended or adjusted under 35 U.S.C. 154(b) by 0 days.

(21) Appl. No.: 17/854,635

(22) Filed: Jun. 30, 2022

(65) Prior Publication Data

US 2023/0004226 A1    Jan. 5, 2023

Related U.S. Application Data

(60) Provisional application No. 63/284,320, filed on Nov. 30, 2021, provisional application No. 63/216,833, filed on Jun. 30, 2021.

(51) Int. Cl.
   *G06F 3/01*     (2006.01)
   *G06F 3/041*    (2006.01)

(52) U.S. Cl.
   CPC ............ *G06F 3/016* (2013.01); *G06F 3/0416* (2013.01)

(58) Field of Classification Search
   CPC .............................. G06F 3/016; G06F 3/0416
   See application file for complete search history.

(56) References Cited

U.S. PATENT DOCUMENTS

| | | | |
|---|---|---|---|
| 10,088,913 B1* | 10/2018 | Olsson | G06F 3/0202 |
| 10,707,034 B2 | 7/2020 | Lisseman et al. | |
| 2010/0302199 A1* | 12/2010 | Taylor | G06F 3/046 345/174 |
| 2012/0112894 A1* | 5/2012 | Yang | G06F 3/016 340/407.1 |
| 2014/0340372 A1* | 11/2014 | Olsson | G06F 3/0338 345/184 |
| 2015/0097791 A1 | 4/2015 | Lisseman et al. | |
| 2015/0097793 A1 | 4/2015 | Lisseman et al. | |
| 2015/0097794 A1 | 4/2015 | Lisseman et al. | |
| 2015/0097795 A1 | 4/2015 | Lisseman et al. | |
| 2018/0194369 A1* | 7/2018 | Lisseman | B60W 50/16 |

* cited by examiner

*Primary Examiner* — Ricardo Osorio
(74) *Attorney, Agent, or Firm* — Meunier Carlin & Curfman LLC

(57) ABSTRACT

A switch assembly that provides haptic feedback includes a printed circuit board (PCB) having a first planar surface that faces in a first direction and a second planar surface that faces in a second direction, the second direction being opposite from the first direction, a touch plate having a first surface that faces in the first direction and a second surface that faces in the second direction, wherein the first surface of the touch plate is proximate the second planar surface of the PCB, and a haptic exciter that has a conductive coil of wire having a hollow inner core and a magnet that is at least partially disposed within the hollow inner core of the coil of wire such that the magnet alternatively moves in the first and second directions as an alternating current passes through the conductive coil of wire.

16 Claims, 9 Drawing Sheets

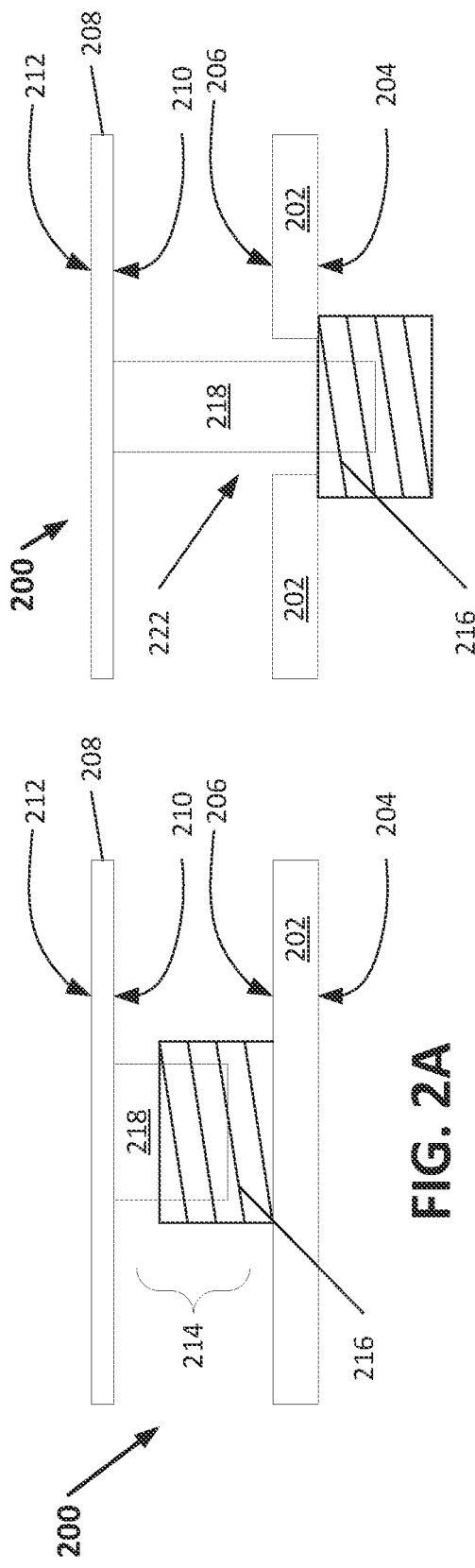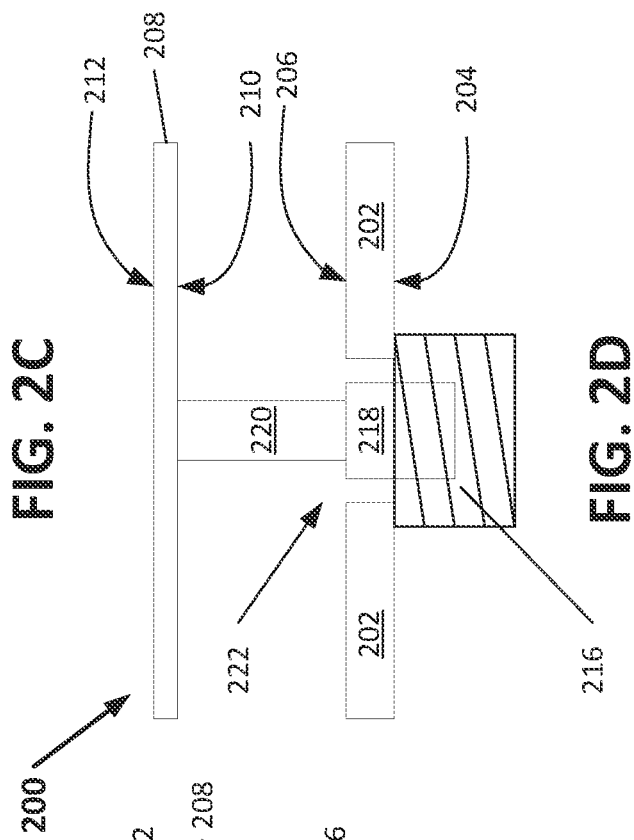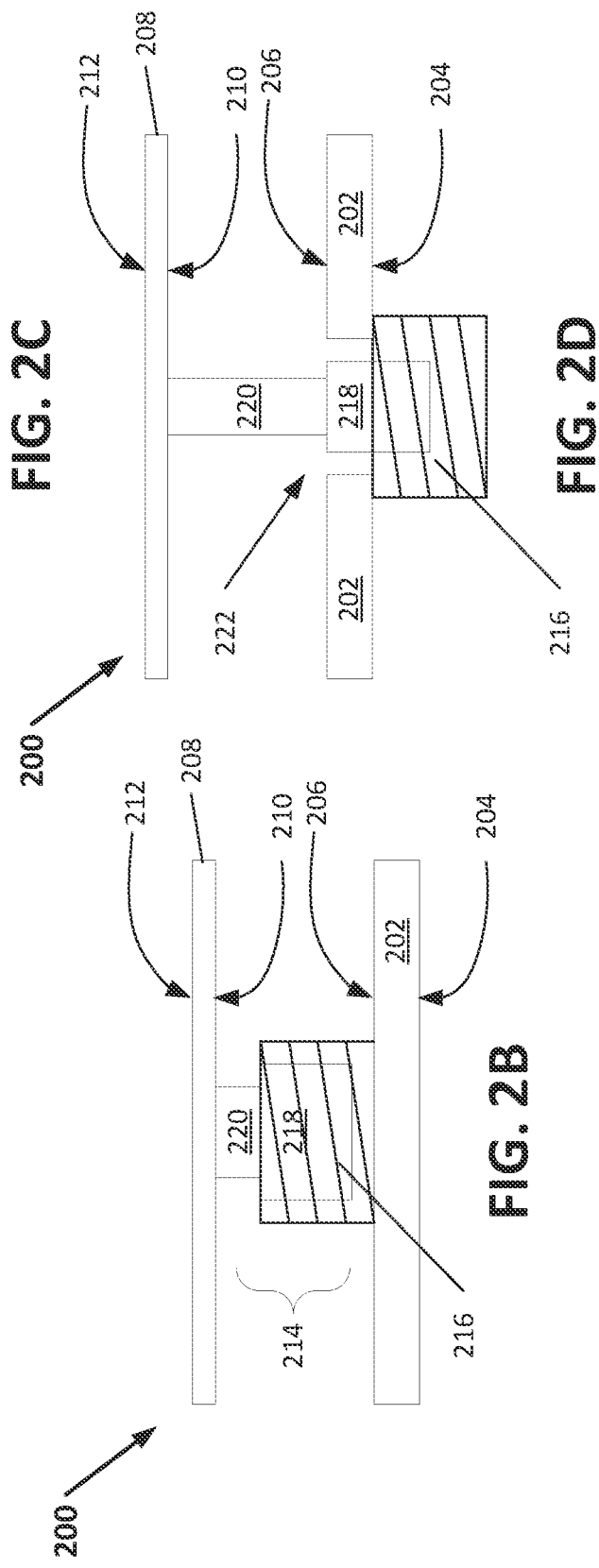

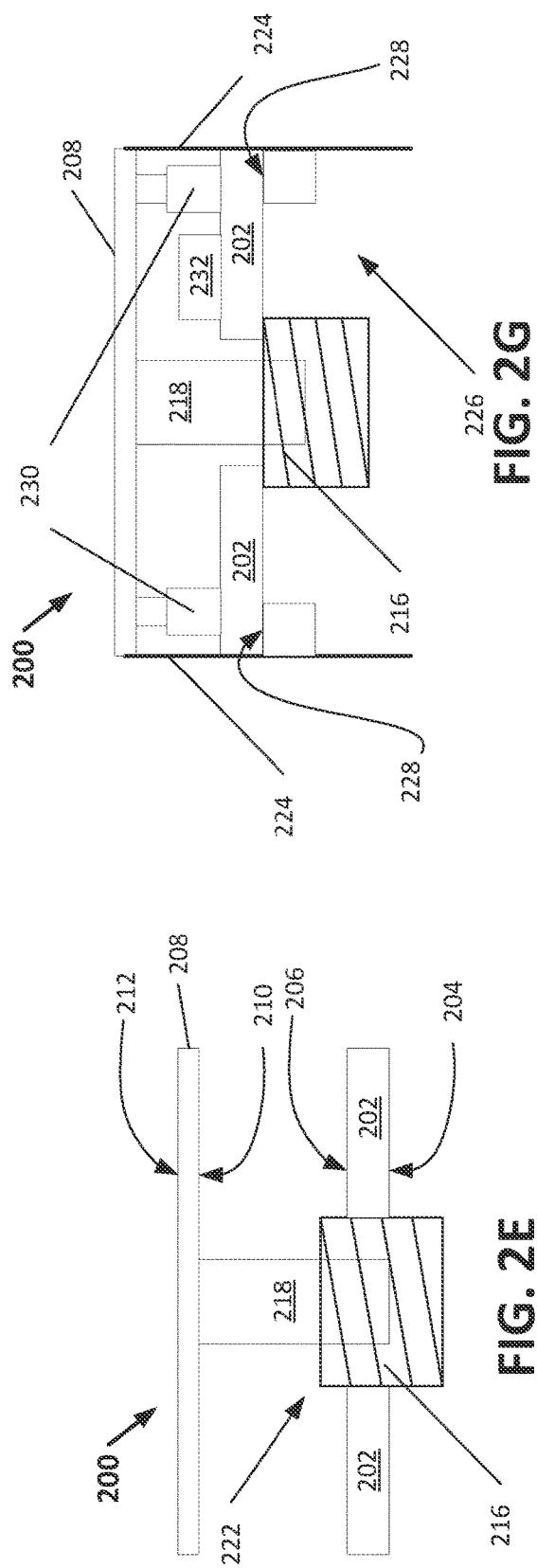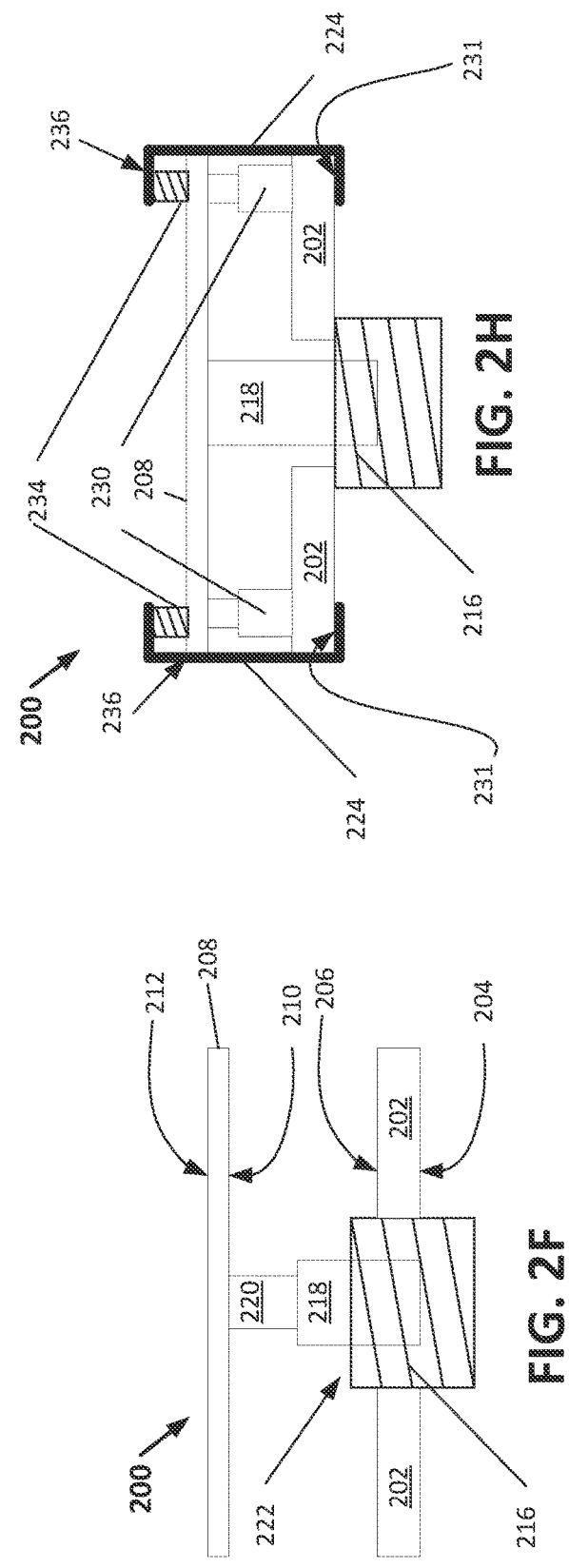

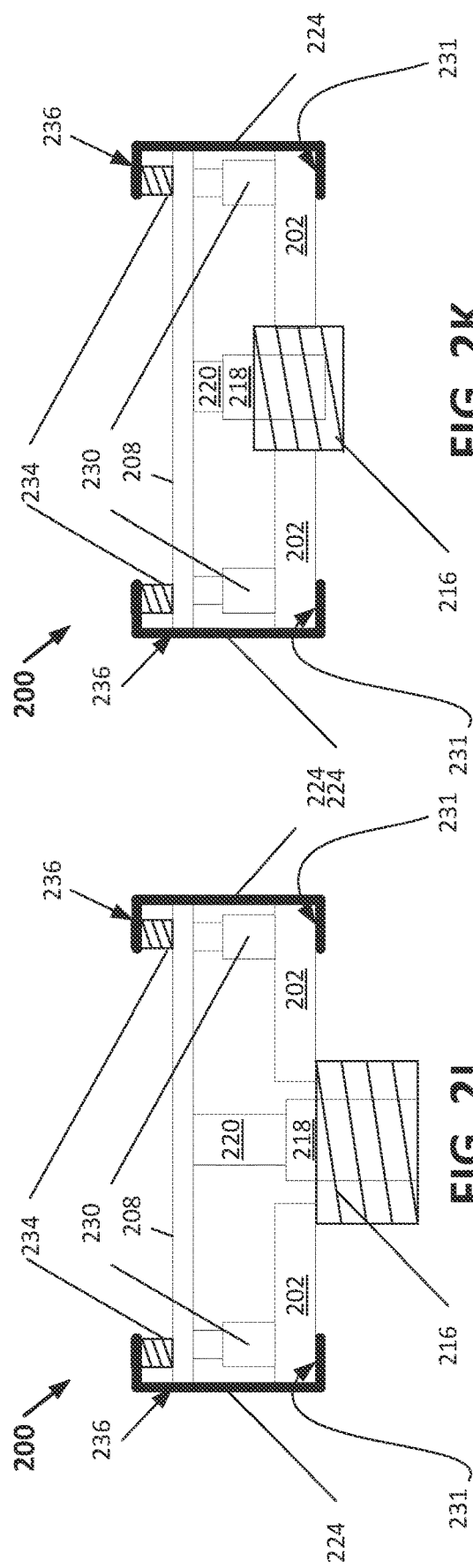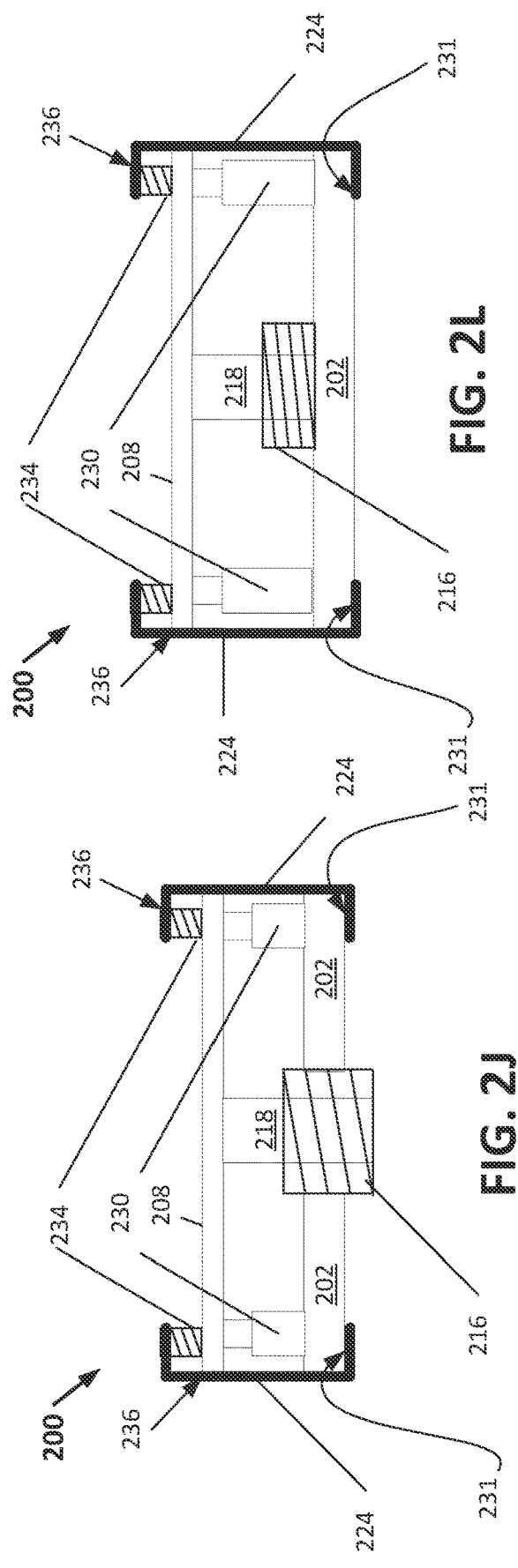

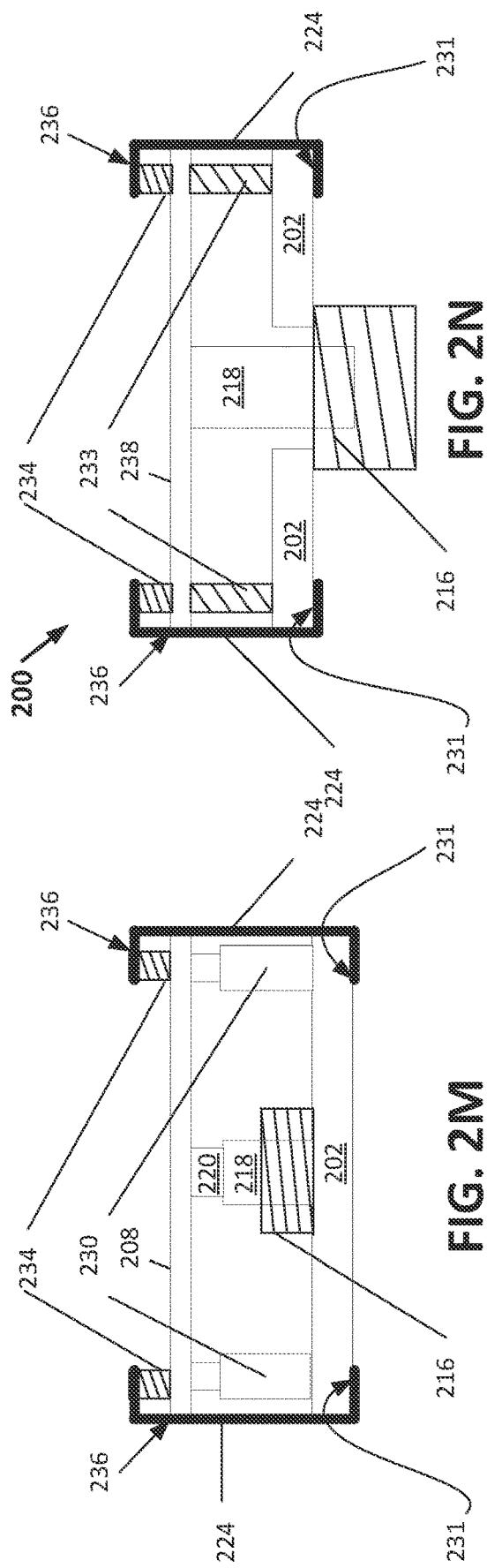

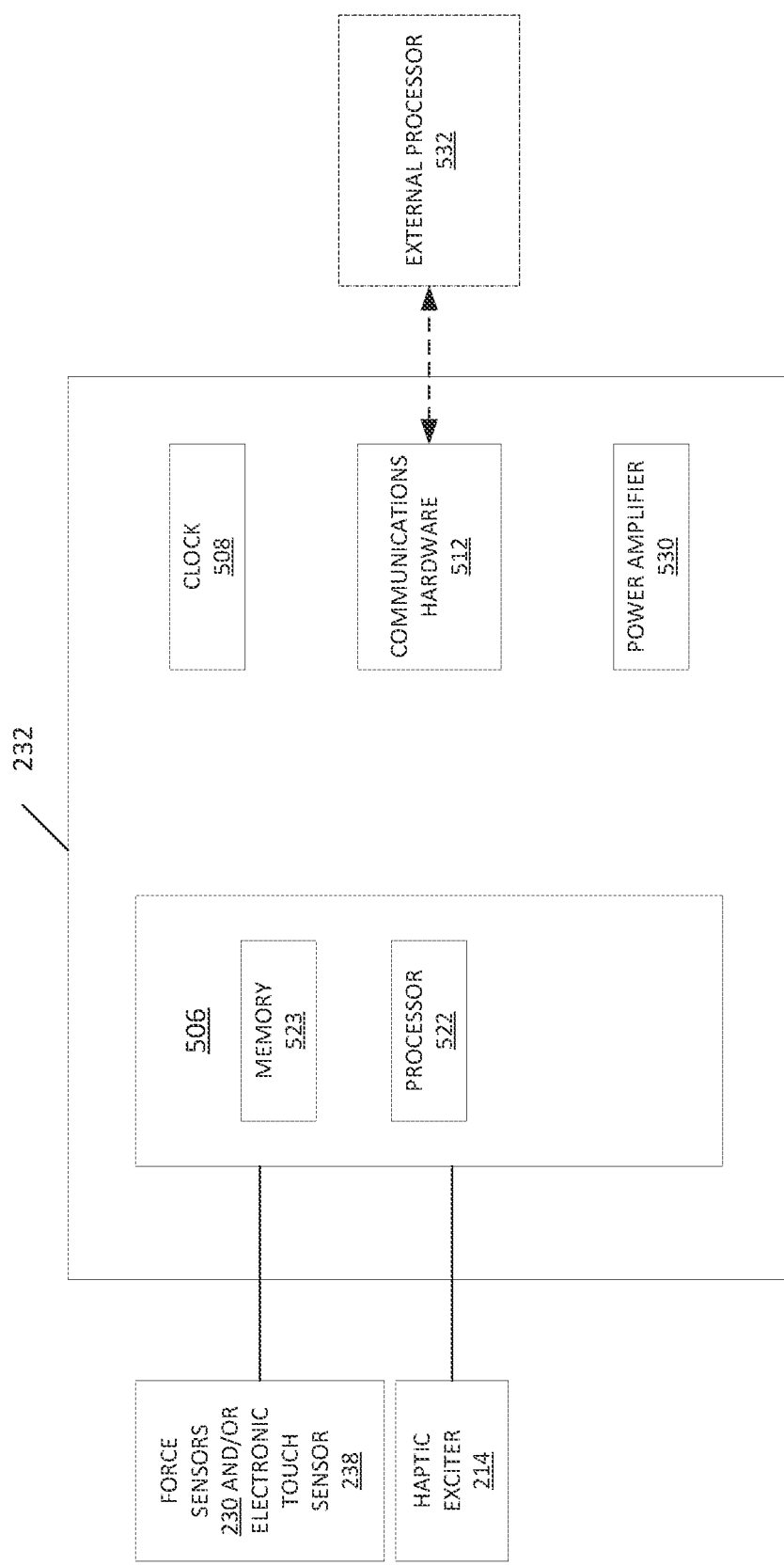

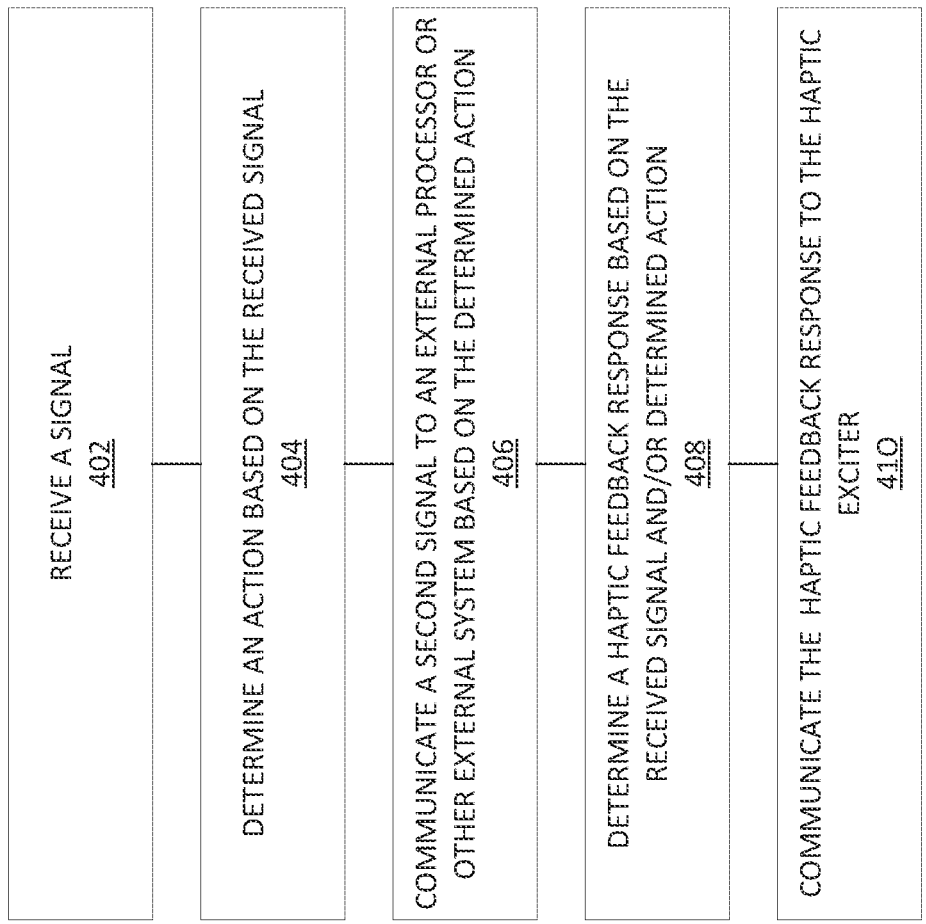

SWITCH ASSEMBLY WITH INTEGRATED HAPTIC EXCITER

CROSS-REFERENCE TO RELATED APPLICATIONS

This application claims priority to and the benefit of U.S. Provisional Patent Application No. 63/216,833, filed Jun. 30, 2021, and U.S. Provisional Patent Application No. 63/284,320, filed Nov. 30, 2021, both of which are incorporated herein by reference in their entireties.

BACKGROUND

Conventional capacitive touchscreen technologies, such as those used in smartphones and tablet devices, require significant visual engagement by a vehicle driver, which is a distraction for the driver and compromises safety. Conventional mechanical switches and knobs are less distracting because they can be safely used without requiring the driver to remove his eyes from the road, but they tend to have limited flexibility, with each switch controlling a single function or feature.

Therefore, switches, such as the ones disclosed and described in U.S. Pat. No. 10,707,034, issued Jul. 7, 2020, which is attached hereto as Appendix A and is fully incorporated by reference, have been developed. These switches provide sufficient feedback to the driver upon receiving driver input to avoid distracting the driver and provide the ability to control multiple functions and/or vehicle systems with a minimal footprint. Typically, this feedback is in the form of tactile and/or audible haptic feedback. Haptic feedback is used in various electronic devices, mostly commonly in toys, cell phones, and the like, and in touch switches, as described herein. There are a few types, but most commonly haptic exciters, which provide the haptic feedback and are motor driven or voice coil driven. Motor driven types commonly drive an unbalanced rotating medium, and the lack of balance causes a vibration perpendicular to the axis of rotation. Voice coil types provide a back and forth motion like a speaker. These are commonly available and are usually designed into products mechanically mounted to a surface of a product that will transfer the vibration or audio appropriately. An example of a typical conventional voice-coil haptic exciter is shown in FIG. 1A.

As shown in FIG. 1B, a typical conventional voice-coil haptic exciter comprises a voice coil, a magnet, a suspension for the magnet, electrical connections for the voice coil, and a mounting surface. In a typical implementation, other than the electrical connections, the voice-coil haptic exciter is separate from the components that comprise the electronic device using the haptic exciter and are only mounted to a surface of the electronic device (see for example FIG. 1C, where the entire assembled conventional voice-coil haptic exciter is mounted on the underside of a touch plate of a switch). The typical design uses a soft plastic housing that serves as a bobbin for the coil, but also provides flexible plastic arms to suspend the magnet in the magnetic field created by the coil. As the coil is energized with an alternating current, the magnet moves up and down. That motion is coupled via the arms to the housing. The housing is typically attached to a surface of the electronic device to transfer the vibration ultimately to the user. The coil is generally connected to a printed circuit board (PCB) of the electronic device either by electrical wires or a connector.

However, cost savings can be realized as well as reduced space usage if characteristics of the mechanical design of the electronic device are used to achieve some of the elements of the voice-coil haptic exciter. Therefore, systems and methods are desired that overcome challenges in the conventional art, some of which are described herein. For example, a switch assembly with a voice-coil haptic exciter that uses characteristics of the mechanical design of the switch assembly as elements of the voice-coil haptic exciter is desired.

SUMMARY

Disclosed and described herein are systems and methods of using characteristics of the mechanical design of the electronic device to achieve some of the elements of the voice-coil haptic exciter. For example, an existing PCB and touch plate of a touch switch with haptic feedback can be used as a suspension for the coil and the magnet. The mounting surface, the magnet itself, may be coupled directly to the touch plate, which is where the vibration is desired. The coil may be soldered directly to the PCB as a surface mounted component, which eliminates a connector or manual wiring/soldering operations.

One implementation of the present disclosure is a switch assembly that provides haptic feedback that includes a printed circuit board (PCB), the PCB having a first planar surface that faces in a first direction and a second planar surface that faces in a second direction, the second direction being opposite from the first direction, a touch plate, the touch plate having a first surface that faces in the first direction and a second surface that faces in the second direction, where the first surface of the touch plate is proximate the second planar surface of the PCB, and a haptic exciter. The haptic exciter includes a conductive coil of wire having a hollow inner core and a magnet that is at least partially disposed within the hollow inner core of the coil of wire such that the magnet alternatively moves in the first and second directions as an alternating current passes through the conductive coil of wire. In some implementations, the conductive coil of wire is mechanically affixed to the PCB. In some implementations, the magnet is directly or indirectly disposed adjacent the first surface of the touch plate Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

These and other features, aspects, and advantages of the present disclosure will become apparent from the following description and the accompanying exemplary implementations shown in the drawings, which are briefly described below:

FIG. 2A-2F illustrate cross-sectional views of implementations of a touch-based switch assembly that include an integrated haptic exciter to provide haptic feedback;

FIG. 2G illustrates a cross-sectional view of an implementation of a touch-based switch assembly that that includes an integrated haptic exciter to provide haptic feedback further comprising a housing having one or more walls that define a chamber, one or more force sensors disposed on the PCB, and a processor in electrical communication with a memory, also disposed on the PCB;

FIGS. 2H-2N illustrate additional implementations of a switch assembly that further comprises a housing comprised of one or more walls that form a modular switch assembly unit;

FIG. 3 illustrates a block diagram of an electrical control system according to implementations described herein; and FIG. 4 illustrates a flow diagram of instructions stored on a memory for execution by a processor disposed on the PCB, according to implementations described herein.

DETAILED DESCRIPTION

Figure 1A:
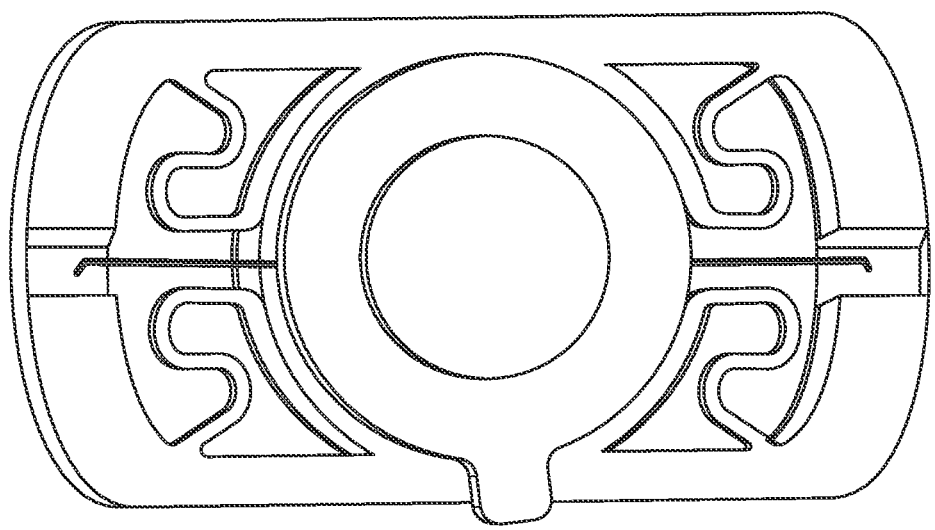
FIG. 1A illustrates a typical conventional voice-coil haptic exciter.
Figure 1B:
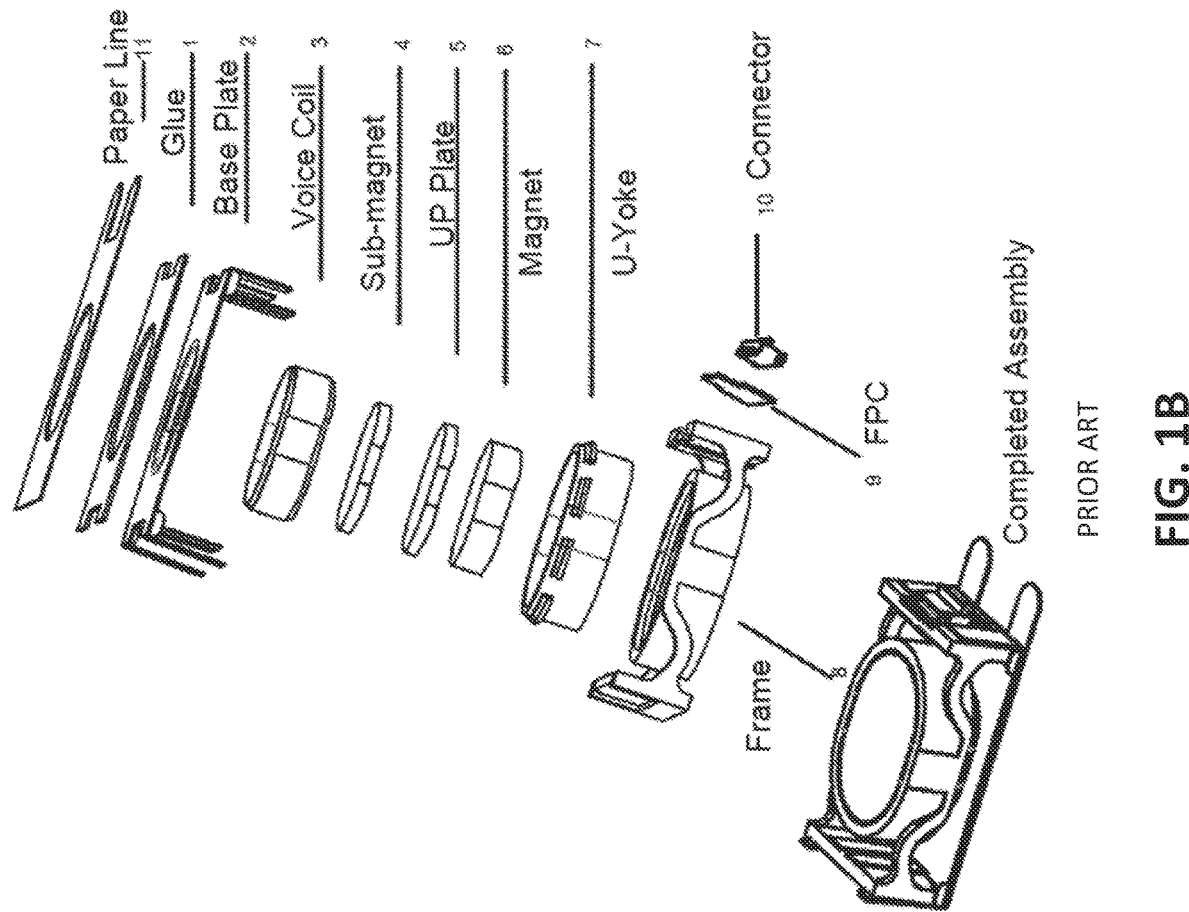
FIG. 1B illustrates an exploded view of a typical conventional voice-coil haptic exciter.
Figure 1C:
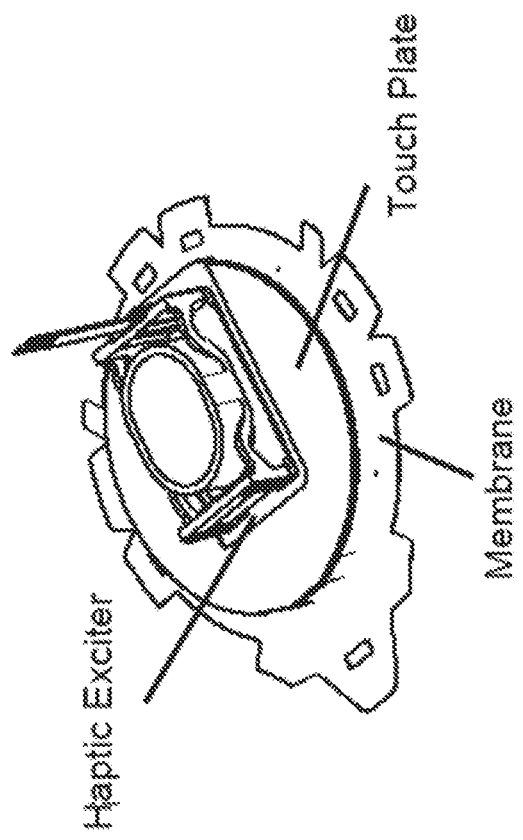
FIG. 1C illustrates an entire assembled conventional voice-coil haptic exciter mounted on the underside of a touch plate of a switch assembly.

Before the present methods and systems are disclosed and described, it is to be understood that the methods and systems are not limited to specific synthetic methods, specific components, or to particular compositions. It is also to be understood that the terminology used herein is for the purpose of describing particular implementations only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another implementation includes all values from the one particular value and/or to the other particular value. Similarly, when values are expressed as approximations, by use of the antecedent "about," it will be understood that the particular value forms another implementation. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers, or steps. "Exemplary" means "an example of" and is not intended to convey an indication of a preferred or ideal implementation. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combination and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific implementation or combination of implementations of the disclosed methods.

The present methods and systems may be understood more readily by reference to the following detailed description of preferred implementations and the Examples included therein and to the Figures and their previous and following description.

FIG. 2A illustrates a cross-sectional view of an implementation of a touch-based switch assembly 200 that includes an integrated haptic exciter 214 to provide haptic feedback. The assembly 200 includes a printed circuit board (PCB) 202. The PCB 202 has a first planar surface 204 that faces in a first direction and a second planar surface 206 that faces in a second direction, the second direction being opposite from the first direction. The assembly further includes a touch plate 208. The touch plate 208 has a first surface 210 that faces in the first direction and a second surface 212 that faces in the second direction. The first surface 210 of the touch plate 208 is proximate the second planar surface 206 of the PCB 202. The assembly 200 further includes an integrated haptic exciter 214. The haptic exciter 214 comprises a conductive coil of wire 216 (e.g., copper magnet wire, and the like) and a magnet 218. The coil of wire 216 has a hollow inner core, and at least a portion of the magnet 218 is disposed within the hollow inner core of the coil of wire 216 such that the magnet 218 alternatively moves in the first and second directions as an alternating current passes through the conductive coil of wire 216 creating a magnetic field. Rather than being a total separate device, the haptic exciter 214 is integrated into the switch assembly 200 as the conductive coil of wire 216 is mechanically affixed to the PCB 202. As can be seen in FIG. 2A, the magnet 218 is directly or indirectly disposed adjacent the first surface 210 of the touch plate 208. For example, the magnet 218 may be in contact with the first surface 210 of the touch plate 208 and, in some instances, the magnet 218 may be affixed to the first surface 210 of the touch plate 208. For example, the magnet 218 may be affixed to the first surface 210 of the touch plate 208 using one or more of glue, adhesives, fasteners, compression fit, welding, molding, and the like. The movement of the magnet 218 causes a palpable vibration and/or sound in the touch plate 208. In effect, the touch plate 208 becomes the voice cone of the haptic exciter 214. As such, at least a portion of the touch plate 208 may be comprised of flexible material. For example, the outer edge of the touch plate 208 may be comprised of flexible material such that the central portion of the touch plate 208 is "suspended" by the flexible material.

Generally, the conductive coil of wire 216 is in electrical communication with a circuit on the PCB 202; however, it is also contemplated that the conductive coil of wire 216 may be in electrical communication with circuits that are not included on the PCB 202 while the coil 216 is still physically mounted to the PCB 202. For example, the haptic exciter 214 may include a flexible cable connector (not shown) that has a first end that is coupled to the haptic exciter 214 and a second end that is coupled to the PCB 202. The flexible cable connector minimizes or eliminates transmission of the vibration from haptic exciter 214 to the PCB 202 while allowing the haptic exciter 214 to be electrically coupled to the PCB 202. In one non-limiting example, the flexible cable connector may be a zero insertion force (ZIF)-type connector. In other implementations, the haptic exciter 214 is coupled to the PCB 202 with wires that are coupled to each via soldering or other suitable coupling mechanisms.

FIG. 2B illustrates an implementation where the magnet 218 is in indirect contact with the first surface 210 of the touch plate 208. For example, the magnet 218 may be in indirect contact with the first surface 210 of the touch plate 208 through a spacer 220. As such, the spacer 220 may be in contact with the first surface 210 of the touch plate 208 and/or may be affixed to the first surface 210 of the touch plate 208. For example, the spacer 220 may be affixed to the first surface 210 of the touch plate 208 using one or more of glue, adhesives, fasteners, compression fit, welding, molding, and the like. Similarly, the magnet 218 may be affixed to the spacer 220 using one or more of glue, adhesives, fasteners, compression fit, welding, molding, and the like.

As shown in FIGS. 2A and 2B, the conductive coil of wire 216 is affixed to the second planar surface 206 of the PCB 202. For example, it may be soldered to the PCB 202, molded into the dielectric material of the PCB 202, screwed, glued, adhered, or otherwise fastened to the PCB 202. In some instances, the coil of wire 216 may be affixed to the PCB 202 using surface mount technology (SMT) common in the fabrication of PCBs and their circuits. In other instances, the conductive coil of wire 216 may be affixed to the first planar surface 204 of the PCB 202, as shown in FIGS. 2C and 2D. In such instances, the PCB 202 may define an opening 222 and at least a portion of the haptic exciter 214 extends into the opening 222. For example, at least a portion of the magnet 218 and/or the spacer 220 may extend into the opening 222 in the PCB 202.

In yet other implementations, the conductive coil of wire 216 may be affixed to a side of the opening 222 in the PCB 202, and the conductive coil of wire 216 extends at least partially into the opening 222, as shown in FIGS. 2E and 2F.

FIG. 2G illustrates a cross-sectional view of an implementation of a switch assembly 200 that further comprises a housing comprised of one or more walls 224 that define a chamber 226, where the PCB 202 is disposed within the chamber 226. For example, the walls 224 of the housing may be comprised of plastic or other suitable material. In such an implementation, the PCB 202 is affixed to at least one wall 224 of the housing. For example, the switch assembly 200 may include at least one support surface 228 facing in the second direction, the support surface 228 being fixedly coupled to the housing such that the support surface 228 is in contact with and supports the first planar surface 204 of the PCB 202 within the chamber 226. In some instances, at least a portion of the first planar surface 204 of the PCB 202 is affixed to the support surface 228. Further, in some instances, at least a portion of the touch plate 208 may be affixed to the walls 224 of the housing. For example, the touch plate 208 may define an end wall that covers an end of the housing.

As further shown in FIG. 2G, one or more force sensors 230 may be disposed on the second planar surface 206 of the PCB 202. The one or more force sensors 230 may be micro electro-mechanical sensors (MEMS) that provide an output signal that corresponds with an amount of force received by the sensors and are able to detect force with as little as 2 microns of displacement. In other implementations, the one or more force sensors 230 may be piezoelectric force sensors, optical force sensors, and/or any other types of sensor that can measure force. The one or more force sensors 230 are configured to detect a force applied to the second surface 212 of the touch plate 208 and/or detect a location of the force applied to the second surface 212 of the touch plate 208. Further comprising the switch assembly may be a processor in electrical communication with a memory (collectively, the processor and memory comprise an electrical control system and are shown as element 232 in FIG. 2G and are described in further detail below in relation to FIG. 3), the memory stores instructions for execution by the processor. In one implementation, the instructions may cause the processor to receive a signal from each of the one or more force sensors 230, the signal being associated with a force received by each of the force sensors 230, determine a force magnitude and/or x,y location associated with the received force signals, and communicate the force magnitude and/or x,y location to a second processor. The second processor may be a processor disposed other than on the PCB 202 and/or not associated with the switch assembly 200. Alternatively or optionally, the instructions stored on the memory may cause the processor to receive the force magnitude, identify a haptic feedback response associated with the force magnitude, and communicate the haptic feedback response to the haptic exciter 214.

Though FIG. 2G shows the coil of wire 216 affixed to the first planar surface 204 of the PCB 202, it is to be appreciated that the haptic exciter 214, coil of wire 216, magnet (and optional spacer 220) may be arranged as shown in any of FIGS. 2A-2F.

FIGS. 2H-2N illustrate additional implementations of a switch assembly 200 that further comprises a housing 236 comprised of one or more walls 224 that form a modular switch assembly unit. The walls 224 of the housing 236 are used to contain and support the PCB 202, touch plate 208, and other elements that form the switch assembly 200. As shown in FIGS. 2H-2N, the housing 236 provides a support surface 231 for the PCB 202. Furthermore, in some implementations, a spring 234 is placed between a portion of the housing 236 and the touch plate 208, which allows movement of the touch plate within the housing 236. As used herein, "spring" refers to coil springs, leaf springs or a material with spring-like properties such as rubber.

In some implementations, as shown in FIG. 2N, the touch plate comprises all or a portion of an electronic touch sensor 238 such as a capacitive touch sensor or other electronic means of detecting touch/force that do not rely on force sensors. In such instances, the touch sensor 238 may be fully suspended by springs 234 above and 233 below the touch sensor, which allows the touch sensor 238 to have motion for a full 360 degrees of the driving sine wave. Though FIG. 2N shows the coil of wire 216 affixed to the first planar surface 204 of the PCB 202, it is to be appreciated that the haptic exciter 214, coil of wire 216, magnet 218 (and optional spacer 220) may be arranged as shown in any of FIGS. 2A-2M.

In some implementations, the switch assemblies 200 described above are mountable within a vehicle. For example, the switch assemblies 200 are mountable to a steering wheel, such as to the bevel or hub or spoke of the steering wheel, for use in controlling various vehicle systems. In other examples, the switch assemblies 200 are mountable to a vehicle door, gear shifter, dashboard, or any portion of the vehicle where input can be provided and used to control one or more vehicle systems.

For example, in some implementations, such as those described above, the housing is coupled to a trim piece in the vehicle instead of a frame or support portion of the vehicle, which isolates the vibration from the haptic exciter 214 from other portions of the vehicle. This arrangement also allows the gap between edges of the trim piece and the outer edge of the assembly to be minimized because the trim piece can move with the assembly.

FIG. 3 illustrates a block diagram of an electrical control system 232, according to one implementation. The electrical control system 232 may include a computing unit 506, a system clock 508, and communication hardware 512. In its most basic form, the computing unit 506 includes a processor 522 and a system memory 523 disposed on the PCB 202.

The processor 522 may be a standard programmable processor that performs arithmetic and logic operations necessary for operation of the electrical control system 232. The processor 522 may be configured to execute program code encoded in tangible, computer-readable media. For example, the processor 522 may execute program code stored in the system memory 523, which may be volatile or non-volatile memory. The memory 523, which can be embodied within non-transitory computer readable media, stores instructions for execution by the processor 522. The system memory 523 is only one example of tangible, computer-readable media. In one aspect, the computing unit 506 can be considered an integrated device such as firmware. Other examples of tangible, computer-readable media include floppy disks, CD-ROMs, DVDs, hard drives, flash memory, or any other machine-readable storage media, wherein when the program code is loaded into and executed by a machine, such as the processor 522, the machine becomes an apparatus for practicing the disclosed subject matter. The term "processor" as used herein may be construed to refer to one or more processors. Furthermore, the term "memory" as used herein may be construed to refer to one or more storage devices. For example, FIG. 3 shows the electrical control system 232 comprising a processor 522, but more or fewer processors may be used and may collectively be referred to as a "processor." Similarly, the electrical control system 232 may include more than one memory. For example, FIG. 3 illustrates one memory 523, but more or fewer memories may be used and may collectively be referred to as a "memory." The processors and/or memories of the electrical control system 232 and/or force sensors 230 may be disposed on any side of the PCB 202.

In addition, the processor 522 is in electrical communication with the force sensors 230 and/or the electronic touch sensor 238 (depending upon the type of switch implemented). In some implementations, the system 232 may further include communications hardware 512 (e.g., a transceiver) that is in electrical communication with the processor 522 and one or more external processors 532. Such external processor 532 may comprise all or a portion of a vehicle system. And, in some implementations, the system 232 may further include a power amplifier 530 that is in electrical communication with the processor 522 and the haptic exciter 214.

Aspects of the present disclosure are described above with reference to flowchart illustrations and/or block diagrams of methods, apparatus (systems) and computer program products according to implementations of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

FIG. 4 illustrates a flow diagram of instructions stored in the memory 523 for execution by the processor 522 according to one implementation. The instructions cause the processor 522 to: (402) receive a signal. The signal may be from one or more force sensors 230, the signal being associated with a force received by each of the force sensors 230, or the signal may be from an electronic touch sensor 238 such as a capacitive touch sensor, or from any other means of detecting a touch and/or force on a touch plate 208 and/or touch sensor 238. At 404, determine an action based on the received signal. For example, the action may be to turn on/off cruise control, increase/decrease cruise control speed, turn on/off an audio system, turn up/down the volume of the audio system, turn on/off an HVAC system, turn the temperature up/down of the HVAC system, turn on/off headlights, turn on/off windshield wipers or change their speed/delay, etc. At 406, a second signal is communicated to an external processor 532 and/or an external system based on the determined action. For example, a signal may be communicated to a cruise control system, an audio system, an HVAC system, headlights, etc. based on the action determined at 404. At 408, a haptic feedback response is determined based on the received signal and/or the determined action. At 410, this haptic feedback response is communicated to the haptic exciter 214, causing an audible and/or tactile haptic response in the touch plate 208 and/or touch sensor 238.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The implementations were chosen and described in order to best explain the principles of the disclosure and the practical application, and to enable others of ordinary skill in the art to understand the disclosure for various implementations with various modifications as are suited to the particular use contemplated.

What is claimed is:

1. A switch assembly that provides haptic feedback, the switch assembly comprising: a printed circuit board (PCB), the PCB having a first planar surface that faces in a first direction and a second planar surface that faces in a second direction, the second direction being opposite from the first direction; a touch plate, the touch plate having a first surface that faces in the first direction and a second surface that faces in the second direction, wherein the first surface of the touch plate is proximate the second planar surface of the PCB; and a haptic exciter, wherein the haptic exciter comprises: a conductive coil of wire having a hollow inner core; and a magnet, wherein at least of portion of the magnet is disposed within the hollow inner core of the coil of wire such that the magnet alternatively moves in the first and second directions as an alternating current passes through the conductive coil of wire, wherein the conductive coil of wire is mechanically affixed to the PCB, and wherein the magnet is directly or indirectly disposed adjacent the first surface of the touch plate, wherein the magnet is in direct or indirect contact with the first surface of the touch plate, wherein the magnet is indirectly affixed to the first surface of the touch plate through a spacer, where the spacer is affixed to the first surface of the touch plate and the magnet is affixed to the spacer, wherein the conductive coil of wire is affixed to the first planar surface of the PCB, wherein the PCB defines an opening and at least a portion of the haptic exciter extends into the opening.

2. The switch assembly of claim 1, wherein the conductive coil of wire is in electrical communication with a circuit on the PCB.

3. The switch assembly of claim 1, wherein the magnet is directly or indirectly affixed to the first surface of the touch plate.

4. The switch assembly of claim 1, wherein the conductive coil of wire is affixed to the second planar surface of the PCB.

5. The switch assembly of claim 1, further comprising one or more force sensors disposed on the second planar surface of the PCB.

6. The switch assembly of claim 5, wherein the one or more force sensors are configured to detect a force applied to the second surface of the touch plate and/or detect a location of the force applied to the second surface of the touch plate.

7. The switch assembly of claim 6, wherein the switch assembly further comprises a processor in electrical communication with a memory, the memory storing instructions for execution by the processor.

8. The switch assembly of claim 7, wherein the instructions cause the processor to:
receive a signal from each of the one or more force sensors, the signal being associated with a force received by each of the force sensors,
determine a force magnitude and/or x,y location associated with the received force signals, and
communicate the force magnitude and/or x,y location to a second processor disposed other than on the PCB.

9. The switch assembly of claim 8, wherein the instructions stored on the memory cause the processor to:
receive the force magnitude,
identify a haptic feedback response associated with the force magnitude, and
communicate the haptic feedback response to the haptic exciter.

10. The switch assembly of claim 7, wherein the instructions cause the processor to:
receive a first signal from at least one of the one or more force sensors;
determine an action based on the received signal;
communicate a second signal to an external processor and/or an external system based on the determined action;
determine a haptic feedback response based on the received signal and/or the determined action; and
communicate the haptic feedback response to the haptic exciter, causing a an audible and/or tactile haptic response in the touch plate.

11. The switch assembly of claim 1, wherein the touch plate comprises all or a portion of an electronic touch sensor, and wherein the electronic touch sensor comprises a capacitive touch sensor.

12. The switch assembly of claim 11, wherein the switch assembly further comprises a processor in electrical communication with a memory, the memory storing instructions for execution by the processor, wherein the instructions cause the processor to:
receive a first signal from the electronic touch sensor;
determine an action based on the received signal;
communicate a second signal to an external processor and/or an external system based on the determined action;
determine a haptic feedback response based on the received signal and/or the determined action; and
communicate the haptic feedback response to the haptic exciter, causing an audible and/or tactile haptic response in the electronic touch sensor.

13. The switch assembly of claim 1, further comprising a housing, wherein at least the PCB and the touch plate are contained within and held in place by the housing.

14. The switch assembly of claim 13, further comprising:
the housing having one or more walls that define a chamber, wherein the PCB is disposed within the chamber; and
at least one support surface facing in the second direction, the support surface being fixedly coupled to the housing, wherein the support surface is in contact with and supports the first planar surface of the PCB within the chamber.

15. The switch assembly of claim 13, further comprising one or more springs, wherein the touch plate is affixed to the housing through the one or more springs so that the touch plate can move at least in one direction as the alternating current passes through the conductive coil of wire of the haptic exciter.

16. A switch assembly that provides haptic feedback, the switch assembly comprising: a printed circuit board (PCB), the PCB having a first planar surface that faces in a first direction and a second planar surface that faces in a second direction, the second direction being opposite from the first direction; a touch plate, the touch plate having a first surface that faces in the first direction and a second surface that faces in the second direction, wherein the first surface of the touch plate is proximate the second planar surface of the PCB; and a haptic exciter, wherein the haptic exciter comprises: a conductive coil of wire having a hollow inner core; and a magnet, wherein at least of portion of the magnet is disposed within the hollow inner core of the coil of wire such that the magnet alternatively moves in the first and second directions as an alternating current passes through the conductive coil of wire, wherein the conductive coil of wire is mechanically affixed to the PCB, and wherein the magnet is directly or indirectly disposed adjacent the first surface of the touch plate, wherein the magnet is in direct or indirect contact with the first surface of the touch plate, wherein the magnet is indirectly affixed to the first surface of the touch plate through a spacer, where the spacer is affixed to the first surface of the touch plate and the magnet is affixed to the spacer, wherein the PCB defines an opening, the conductive coil of wire is affixed to a side of the opening in the PCB, and the conductive coil of wire extends at least partially into the opening.

\* \* \* \* \*